(12) United States Patent
Pyo et al.

(10) Patent No.: US 12,211,403 B2
(45) Date of Patent: Jan. 28, 2025

(54) DISPLAY DEVICE

(71) Applicant: LG ELECTRONICS INC., Seoul (KR)

(72) Inventors: Jonggil Pyo, Seoul (KR); Kwaneun Jin, Seoul (KR); Jaeyong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 200 days.

(21) Appl. No.: 17/905,159

(22) PCT Filed: Feb. 28, 2020

(86) PCT No.: PCT/KR2020/002885
§ 371 (c)(1),
(2) Date: Aug. 26, 2022

(87) PCT Pub. No.: WO2021/172634
PCT Pub. Date: Sep. 2, 2021

(65) Prior Publication Data
US 2023/0092290 A1 Mar. 23, 2023

(51) Int. Cl.
*G09F 9/30* (2006.01)
(52) U.S. Cl.
CPC .................................... *G09F 9/301* (2013.01)
(58) Field of Classification Search
CPC .............................. G06F 1/1652; G09F 9/301
See application file for complete search history.

(56) References Cited

U.S. PATENT DOCUMENTS

| 10,410,549 | B1* | 9/2019 | Kim | G06F 1/1601 |
| 2017/0318693 | A1* | 11/2017 | Kim | H02K 11/21 |
| 2018/0103551 | A1* | 4/2018 | Park | H05K 5/0217 |
| 2018/0125228 | A1* | 5/2018 | Porter | H05K 5/0017 |

FOREIGN PATENT DOCUMENTS

| JP | 2018038648 | 3/2018 |
| KR | 100579035 | 5/2006 |
| KR | 1020090060724 | 6/2009 |
| KR | 1020200004003 | 1/2020 |
| KR | 1020200013549 | 2/2020 |

OTHER PUBLICATIONS

PCT International Application No. PCT/KR2020/002885, International Search Report dated Nov. 13, 2020, 2 pages.

* cited by examiner

*Primary Examiner* — Mukundbhai G Patel
(74) *Attorney, Agent, or Firm* — LEE, HONG, DEGERMAN, KANG & WAIMEY

(57) ABSTRACT

Disclosed is a display device. The display device includes: a flexible display panel; a panel roller which extends long, and around which the display panel is wound, or from which the display panel is unwound; a driving gear which is located in one side of the panel roller, and rotates together with the panel roller; and a motor which is located inside the panel roller, and provides power to the driving gear.

8 Claims, 20 Drawing Sheets

DISPLAY DEVICE

CROSS-REFERENCE TO RELATED APPLICATION(S)

This application is the National Stage filing under 35 U.S.C. 371 of International Application No. PCT/KR2020/002885, filed on Feb. 28, 2020, the contents of which are all incorporated by reference herein in its entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OLED) have been researched and used in recent years.

A liquid crystal panel of the LCD includes a liquid crystal layer, and a TFT substrate and a color filter substrate facing each other with the liquid crystal layer interposed therebetween, and may display an image by using light provided from a backlight unit.

An OLED panel can display an image by depositing an organic material layer that can emit light by itself on a substrate on which a transparent electrode is formed. The OLED panel may have flexible characteristics as well as a thin thickness.

A lot of research has been accomplished on a structural characteristic of a display device having such various panels.

DISCLOSURE

Technical Problem

An object of the present disclosure is to solve the above and other problems. Another object of the present disclosure may be to provide a mechanism for stably rolling or unrolling a flexible display panel.

Another object of the present disclosure may be to provide a frame structure that a display panel can cover or open.

Technical Solution

According to an aspect of the present disclosure, there is provided a display device including: a flexible display panel; a panel roller which extends long, and around which the display panel is wound, or from which the display panel is unwound; a driving gear which is located in one side of the panel roller, and rotates together with the panel roller; and a motor which is located inside the panel roller, and provides power to the driving gear.

According to another aspect of the present disclosure, there is provided a display device including: a flexible display panel; a panel roller which extends long, and around which the display panel is wound, or from which the display panel is unwound; a bottom frame in which the panel roller is rotatably mounted; a motor mounted in the bottom frame; a first vertical frame which extends in a direction intersecting with a length direction of the panel roller, and is fixed to the bottom frame; a first lead screw which is parallel to the first vertical frame, and rotatably coupled to the bottom frame; a first slider which moves in a length direction of the first lead screw when the first lead screw rotates; and a bar to which a distal end of the display panel is fixed, and which is coupled to the first slider.

Advantageous Effects

According to at least one embodiment of the present disclosure, a mechanism for stably rolling or unrolling a flexible display panel may be provided.

According to at least one embodiment of the present disclosure, a frame structure that a display panel can cover or open may be provided.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function. In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Figure 1:
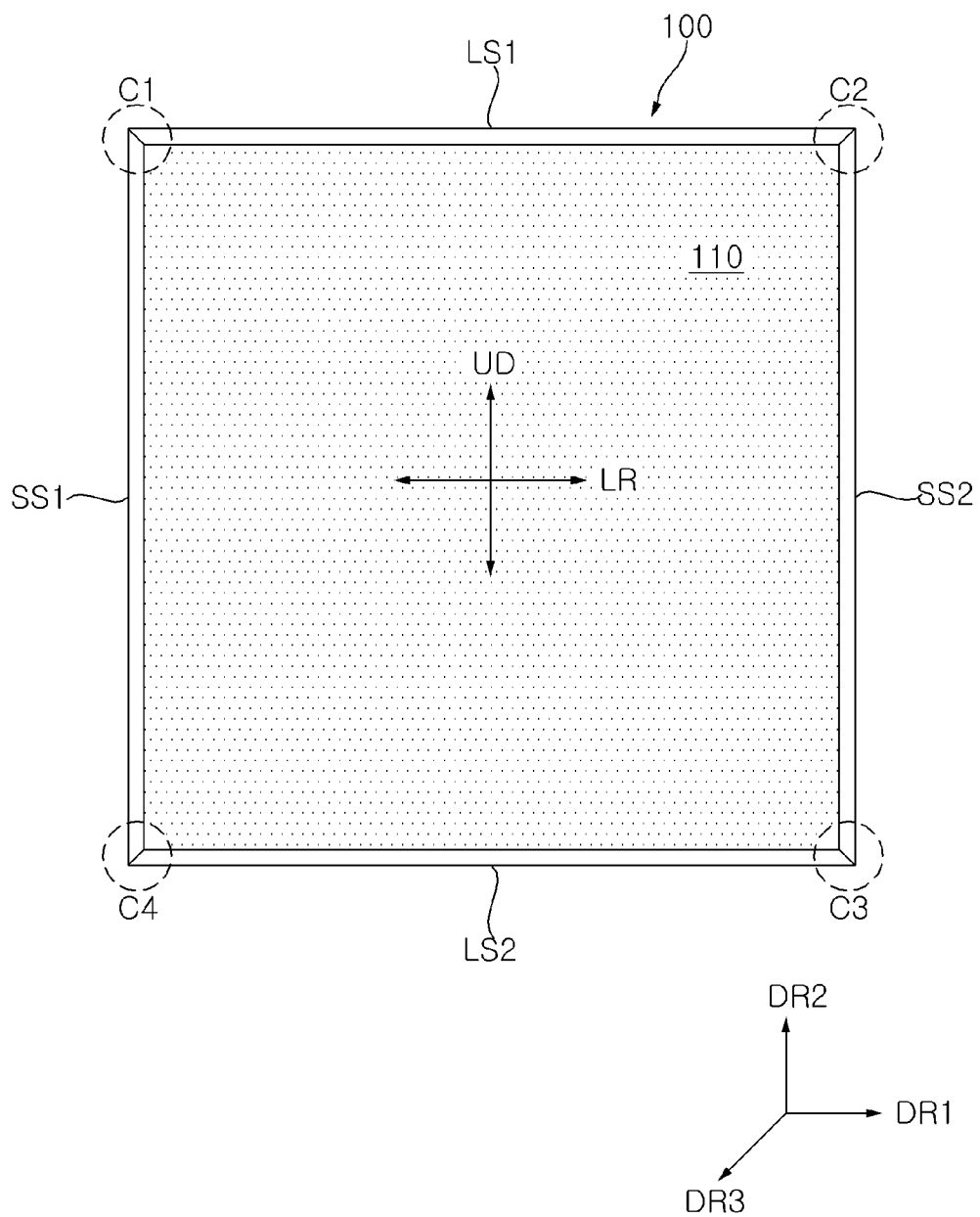
FIGS. 1 to 20 are diagrams illustrating examples of a display device according to embodiments of the present disclosure.

Referring to FIG. 1, a display device may include a first long side LS1, a second long side LS2 opposite the first long side LS1, a first short side SS1 adjacent to one end of the first long side LS1 and the second long side LS2, and a second Short Side SS2 opposite to the first short side SS1.

The first short side area SS1 may be referred to as a first side area, the second short side area SS2 may be referred to as a second side area opposite to the first side area, the first long side area LS1 may be referred to as a third side area which is adjacent to the first side area and the second side area, and located between the first side area and the second side area, and the second long side area LS2 may be referred to as a fourth side area which is adjacent to the first side area and the second side area, located between the first side area and the second side area, and opposite to the third side area.

For convenience of explanation, the lengths of the first and second long sides LS1 and LS2 are illustrated and described as being longer than the lengths of the first and second short sides SS1 and SS2, but a case in which the lengths of the first and second long sides LS1 and LS2 are approximately equal to the lengths of the first and second short sides SS1 and SS2 may also be possible.

In the following, a first direction DR1 may be a direction parallel to the long side LS1, LS2 of the display device, and a second direction DR2 may be a direction parallel to the short side SS1, SS2 of the display device. A third direction DR3 may be a direction perpendicular to the first direction DR1 and/or the second direction DR2.

The first direction DR1 and the second direction DR2 may be collectively referred to as a horizontal direction. In addition, the third direction DR3 may be referred to as a vertical direction.

The side of the first long side LS1 may be referred to as an upper side or an upper surface. The side of the second long side LS2 may be referred to as a lower side or a lower surface. The side of the first short side SS1 may be referred to as a left side or a left surface, and the side of the second short side SS2 may be referred to as a right side or a right surface.

The first long side LS1, the second long side LS2, the first short side SS1, and the second short side SS2 may be referred to as an edge of the display device. In addition, a point where the first long side LS1, the second long side LS2, the first short side SS1, and the second short side SS2 meet each other may be referred to as a corner. For example, a point where the first long side LS1 and the first short side SS1 meet may be a first corner C1, a point where the first long side LS1 and the second short side SS2 meet may be a second corner C2, a point where the second short side SS2 and the second long side LS2 meet may be a third corner C3, and a point where the second long side LS2 and the first short side SS1 meet may be a fourth corner C4.

A direction from the first short side SS1 toward the second short side SS2 or a direction from the second short side SS2 toward the first short side SS1 may be referred to as a left-right direction LR. A direction from the first long side LS1 toward the second long side LS2 or a direction from the second long side LS2 toward the first long side LS1 may be referred to as an up-down direction UD.

Figure 2:
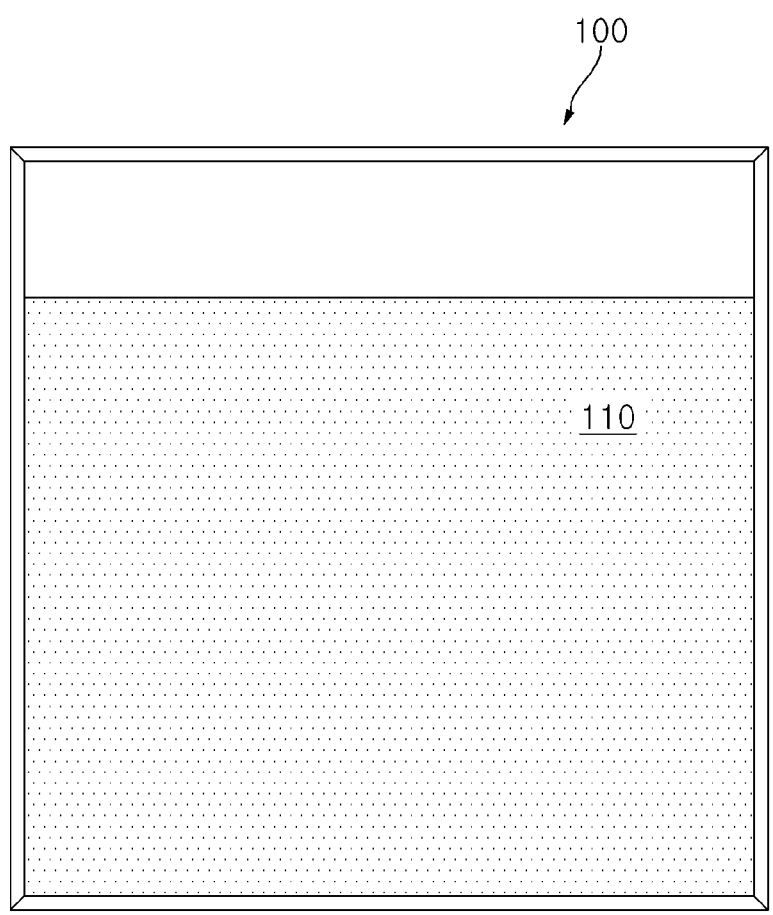
Figure 3:
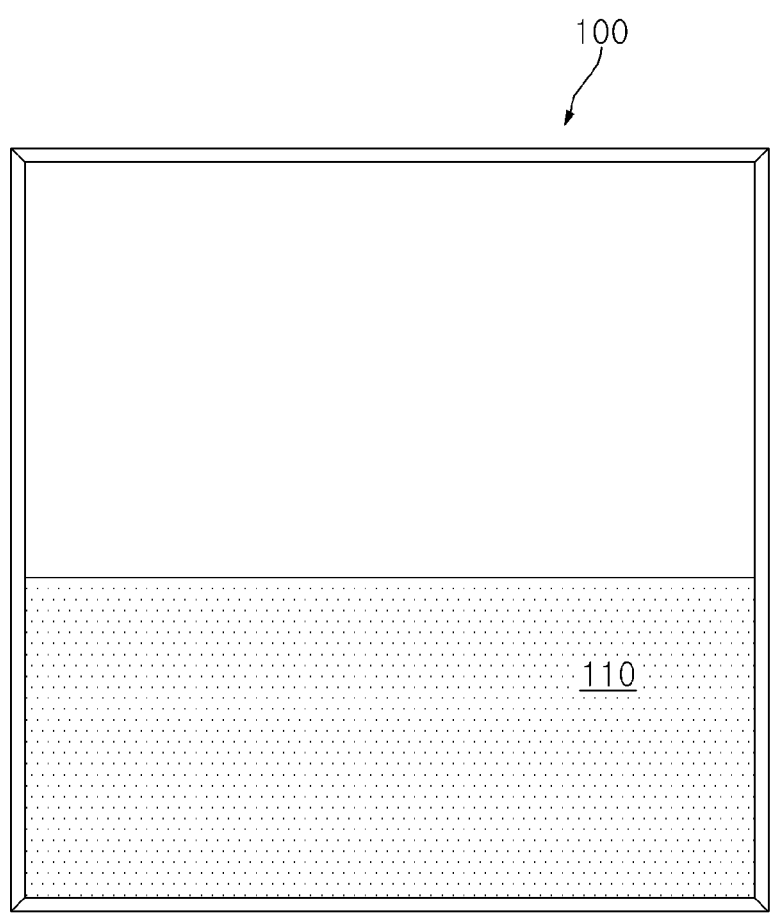

Referring to FIGS. 2 and 3, a display panel 110 may form a front surface of a display device 100, and may move in an up-down direction.

The display panel 110 may cover the front surface of the display device 100 while ascending upward. The display panel 110 may expose the inner side of the display device 100 to the outside while descending downward.

The display panel 110 may cover the front surface of the display device 100 while descending downward. The display panel 110 may expose the inner side of the display device 100 to the outside while ascending upward.

Figure 4:
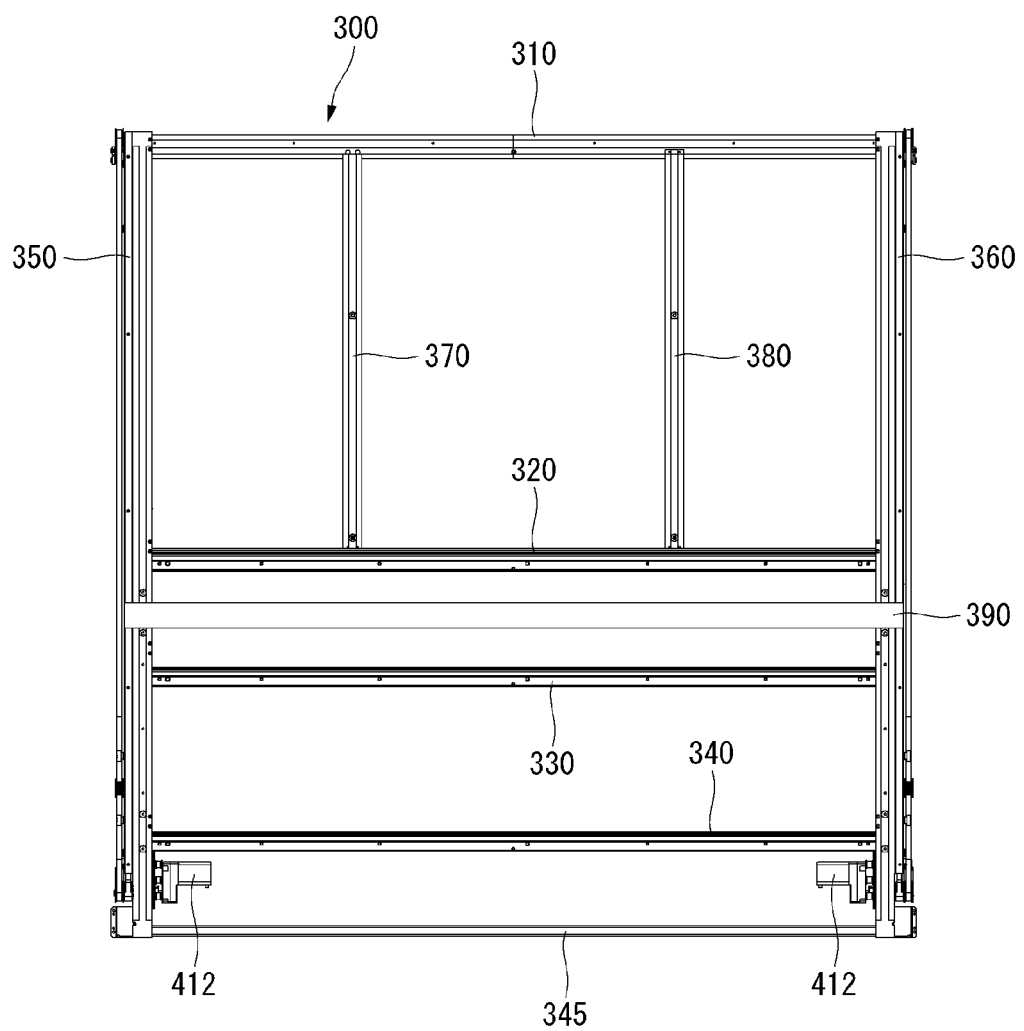
Figure 10:
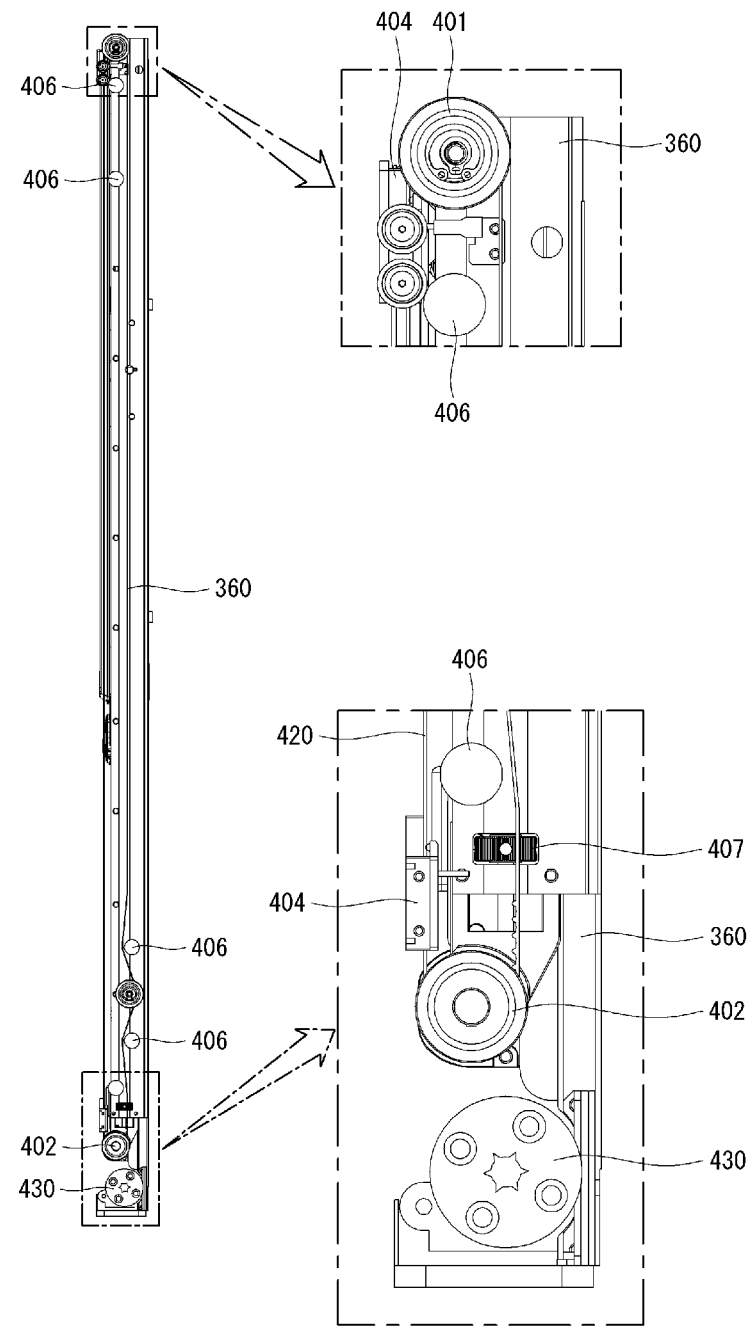

Referring to FIGS. 4 and 10, a frame 300 may form a skeleton of the display device 100 (refer to FIG. 1). The frame 300 may include a horizontal frame 310, 320, 330, 340, and a vertical frame 350, 360, 370, 380. There may be a plurality of horizontal frames 310, 320, 330, 340 and 345. There may be a plurality of vertical frames 350, 360, 370, and 380. The frames 300 may be coupled to each other.

A first horizontal frame 310 may be located in an upper side of the display device. A second horizontal frame 320 may be parallel to the first horizontal frame 310, and located below the first horizontal frame 310. A third horizontal frame 330 may be parallel to the second horizontal frame 320, and located below the second horizontal frame 320. A fourth horizontal frame 340 may be parallel to the third horizontal frame 330, and may be located below the third horizontal frame 330.

A first vertical frame 350 may be located in the left side of the first horizontal frame 310 to the fourth horizontal frame 340, and a second vertical frame 360 may be located in the right side of the first horizontal frame 310 to the fourth horizontal frame 340. A third vertical frame 370 and/or a fourth vertical frame 380 may connect the first horizontal frame 310 and the second horizontal frame 320 to each other.

A bar 390 may extend long from the first vertical frame 350 to the second vertical frame 360, and may move in an up-down direction on the front surfaces of the first vertical frame 350 and the second vertical frame 360.

A bottom frame 345 may form a lower surface of the display device. The frames 300 may be coupled on the bottom frame 345.

Figure 5:
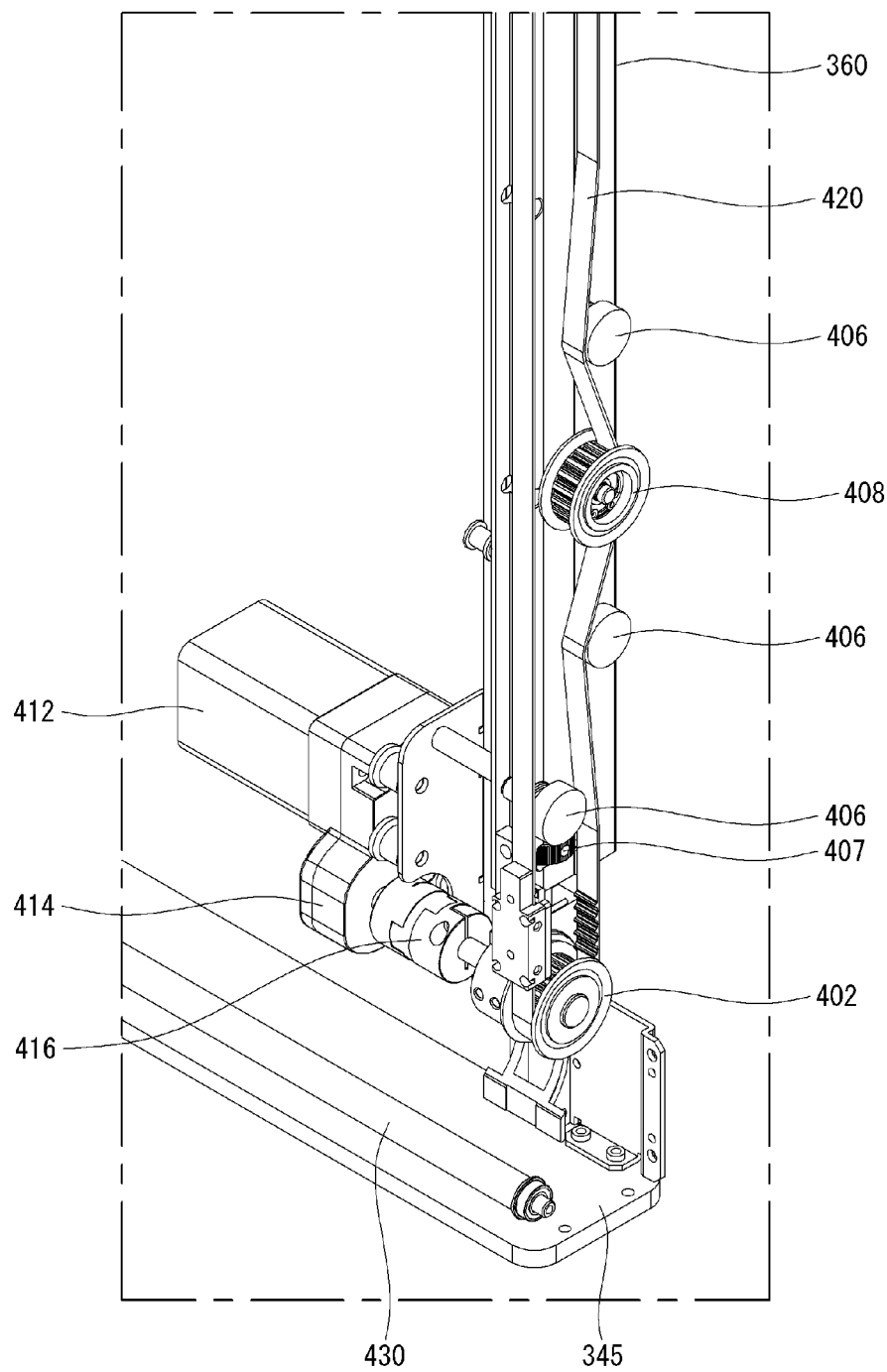

Referring to FIGS. 5 and 10, a motor 412 may be installed in the second vertical frame 360. The motor 412 may provide a rotational force. A gearbox 414 may transmit the rotational force provided by the motor 412. One side of a joint 416 may be connected to the gearbox 414. The rotational force provided from the motor 412 may be transmitted to the joint 416 by adjusting a reduction gear ratio through the gearbox 414.

A pulley 402 may be rotatably mounted in the second vertical frame 360 while being adjacent to the motor 412. The pulley 402 may be referred to as a lower pulley 402. The pulley 408 may be spaced apart from the lower pulley 402 and be installed on the second vertical frame 360. The pulley 408 may be referred to as an intermediate pulley 408. The joint 416 may be connected to the pulley 402 and provide rotational force to the pulley 402. A plurality of tension rollers 406 may be installed along the length direction of the second vertical frame 360.

A slider 405 may be fixed on a belt 420. The slider 405 may move between the upper end and the lower end of the second vertical frame 360 according to the movement of the belt 420. A sensor 407 may be mounted on the second vertical frame 360 while being adjacent to the lower pulley 402. The sensor 407 may detect the movement of the slider 402. Accordingly, the movement of the display panel 110 (refer to FIGS. 1 to 3) according to the rotation of the belt 420 may be detected. The display panel 110 may be wound around a panel roller 430.

The same configuration and description may be applied to the first vertical frame 350.

Figure 6:
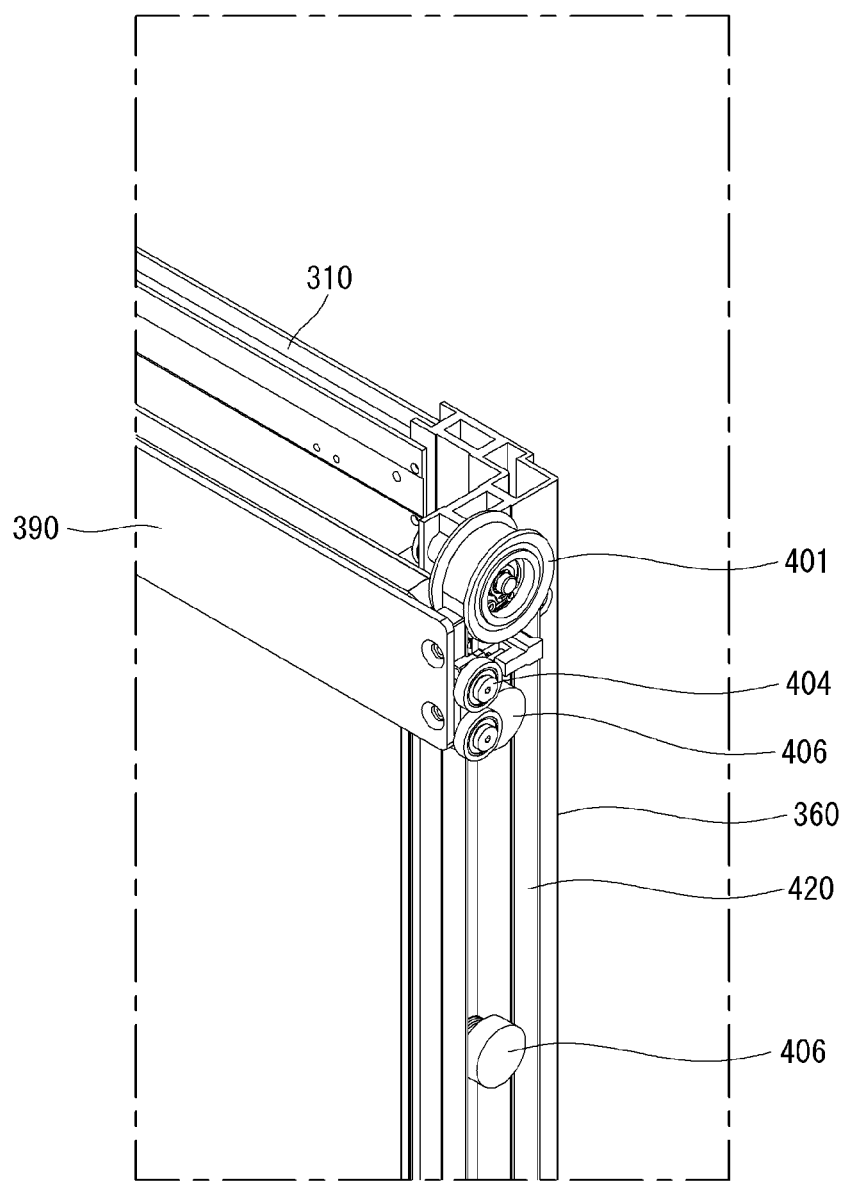

Referring to FIGS. 6 and 10, a pulley 401 may be rotatably mounted adjacent to the upper end of the second vertical frame 360. The pulley 401 may be referred to as an upper pulley 401. A plurality of tension rollers 406 may be installed along the length direction of the second vertical frame 360. The bar 390 may move on the second vertical frame 360. A guide roller 404 may be installed in one end and/or both ends of the bar 390. The guide roller 404 may move on the second vertical frame 360 together with the bar 390. An upper side of the display panel 110 (refer to FIGS. 1 to 3) may be fixed to the bar 390. The same configuration and description may be applied to the first vertical frame 350.

Referring to FIGS. 5, 6 and 10, the belt 420 may be caught on the upper pulley 401, the intermediate pulley 408, and/or the lower pulley 402. For example, belt 420 may be a timing belt. The belt 420 may be caught on the tension roller 406 while being caught on the pulleys 401, 402, and 408 to maintain tension. Accordingly, the belt 420 may maintain a constant tension. The same configuration and description may be applied to the first vertical frame 350 as well.

Figure 7:
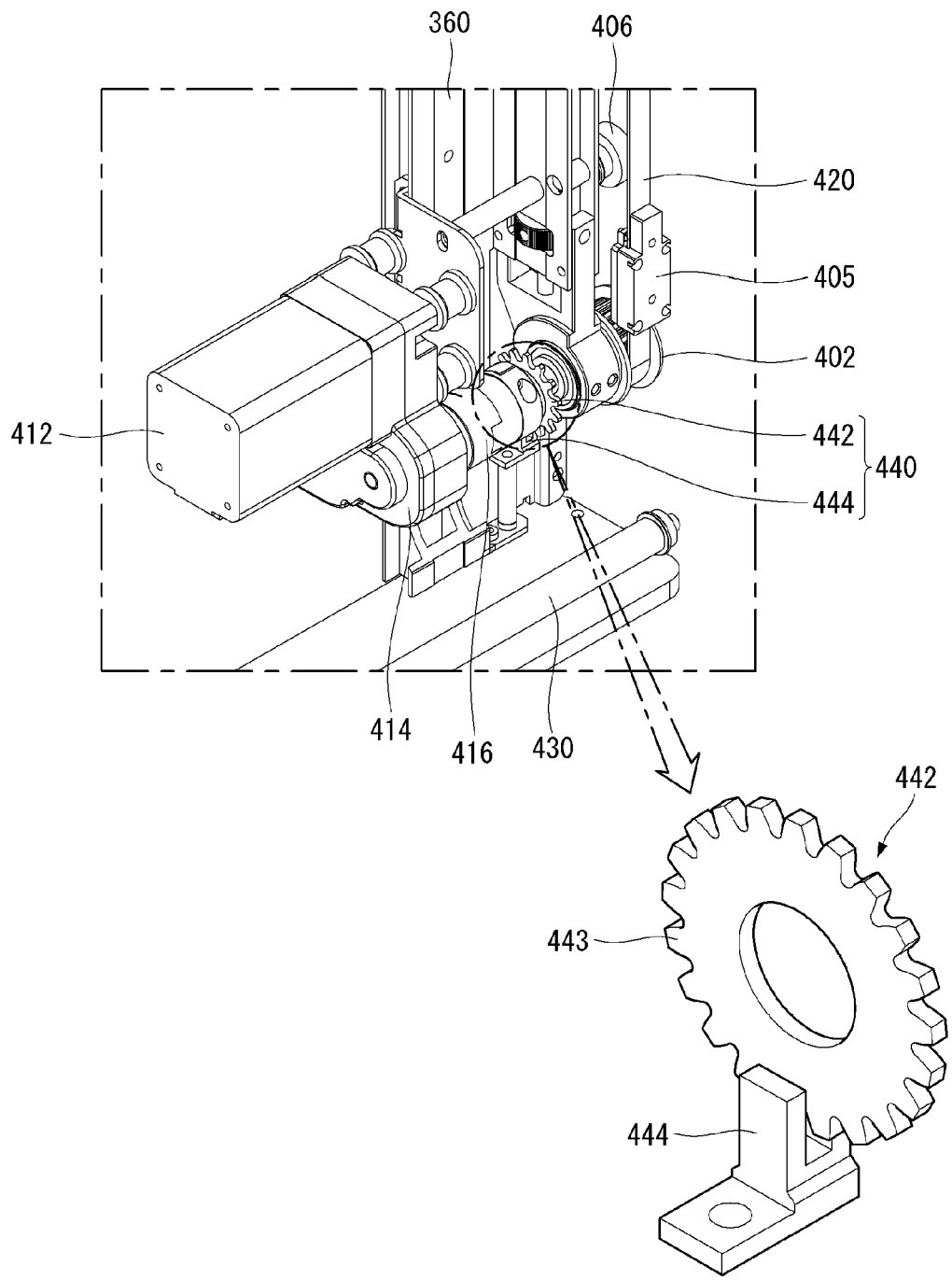

Referring to FIGS. 7 and 10, a rotator 440 may be located between the joint 416 and the pulley 402, and may rotate simultaneously with the rotation of the joint 416 and/or the pulley 402. The rotator 440 may include a plurality of protrusions 443 along a circumference. The sensor 444 may be installed in the second vertical frame 360 while being adjacent to the outer surface of the rotator 440. The sensor 444 may detect the rotation of the rotator 440. The same configuration and description may be applied to the first vertical frame 350 as well. Accordingly, it is possible to synchronize the motors 412 installed in the left and right sides of the frame 300 (refer to FIG. 4).

Figure 8:
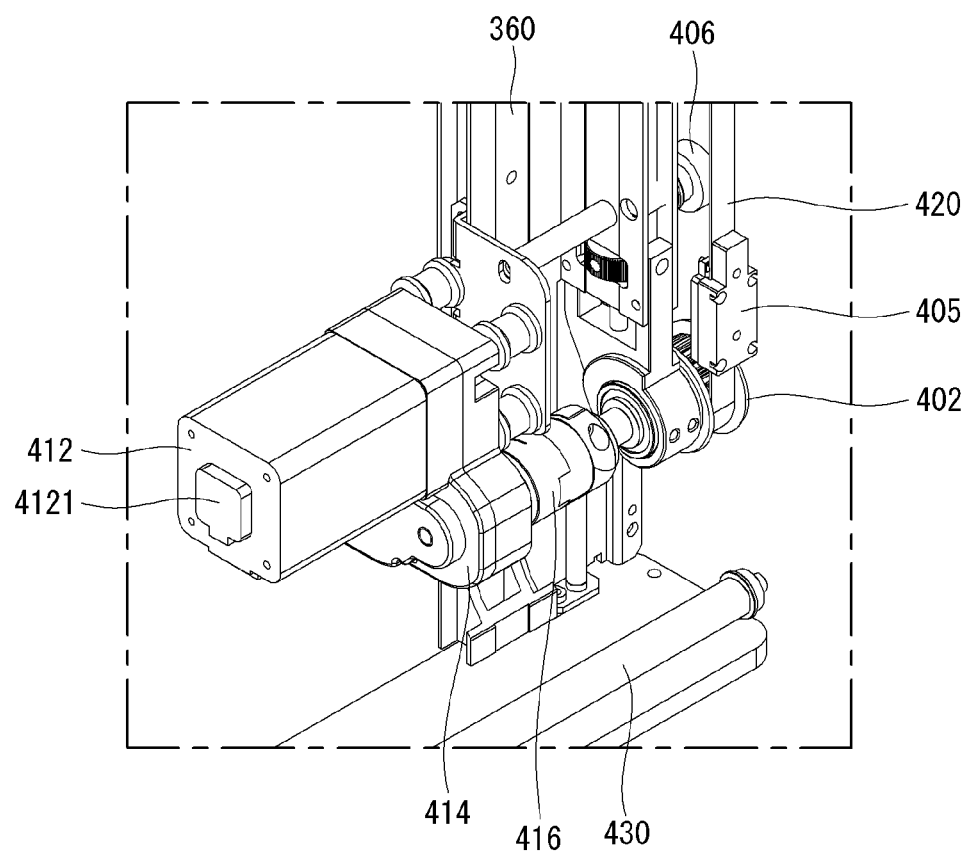

Referring to FIGS. 8 and 10, the motor 412 may be, for example, a stepper motor. An encoder 4121 may be installed in the motor 412. The encoder 4121 may control the rotation of the motor 412. The same configuration and description may be applied to the first vertical frame 350 as well. Accordingly, it is possible to synchronize the motors 412 installed in the left and right sides of the frame 300 (refer to FIG. 4).

Figure 9:
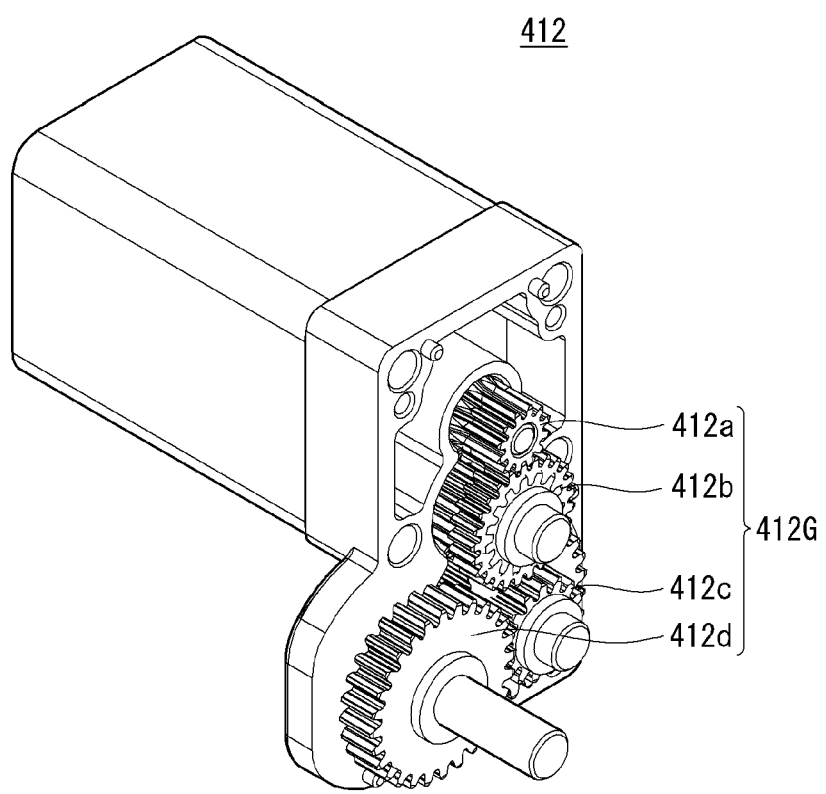

Referring to FIG. 9, the motor 412 may include gears 412G. Gears 412G may include a first gear 412a, a second gear 412b, a third gear 412c, and/or a fourth gear 412d. The first gear 412a may be connected or fixed to the rotation shaft of the motor 412.

For example, the gear ratio of the first gear 412a and the second gear 412b may be 2.08. As another example, the gear ratio of the second gear 412b and the third gear 412c may be 1.87. As another example, the gear ratio of the third gear 412c and the fourth gear 412d may be 1.87. The reduction gear ratio of the first gear 412a to the fourth gear 412d may be, for example, 7.2. The reduction gear ratio of the first gear 412a to the fourth gear 412d may be 6 to 8.

Figure 11:
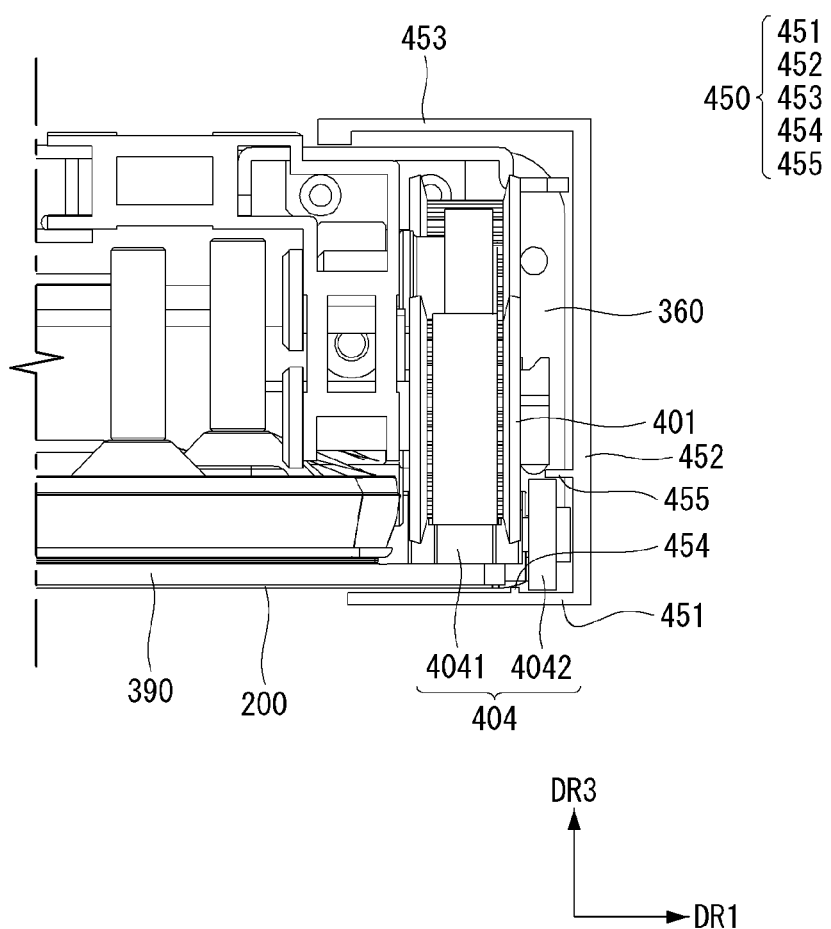

Referring to FIG. 11, the side cover 450 may cover the outer surface of the second vertical frame 360. The side cover 450 may include a first part 451, a second part 452, and a third part 453. The first part 451 may extend in a first direction DR1. The second part 452 may extend in a third direction DR3 and may be connected to the first part 451. The third part 453 may extend in the first direction DR1 and may be connected to the second part 452.

The first part 451 may cover a portion of the front surface of the bar 390. The second part 452 may cover the outer surface of the second vertical frame 360. The third part 453 may be located in the rearward direction of the second vertical frame 360.

The side cover 450 may include guide ribs 454 and 455. The guide ribs 454 and 455 may protrude to an inner side of the first part 451 and/or the second part 452 while being adjacent to the guide roller 404. Accordingly, the movement of the bar 390 and the display panel 110 may be guided.

The same configuration and description may be applied to the first vertical frame 350 as well.

Figure 12:
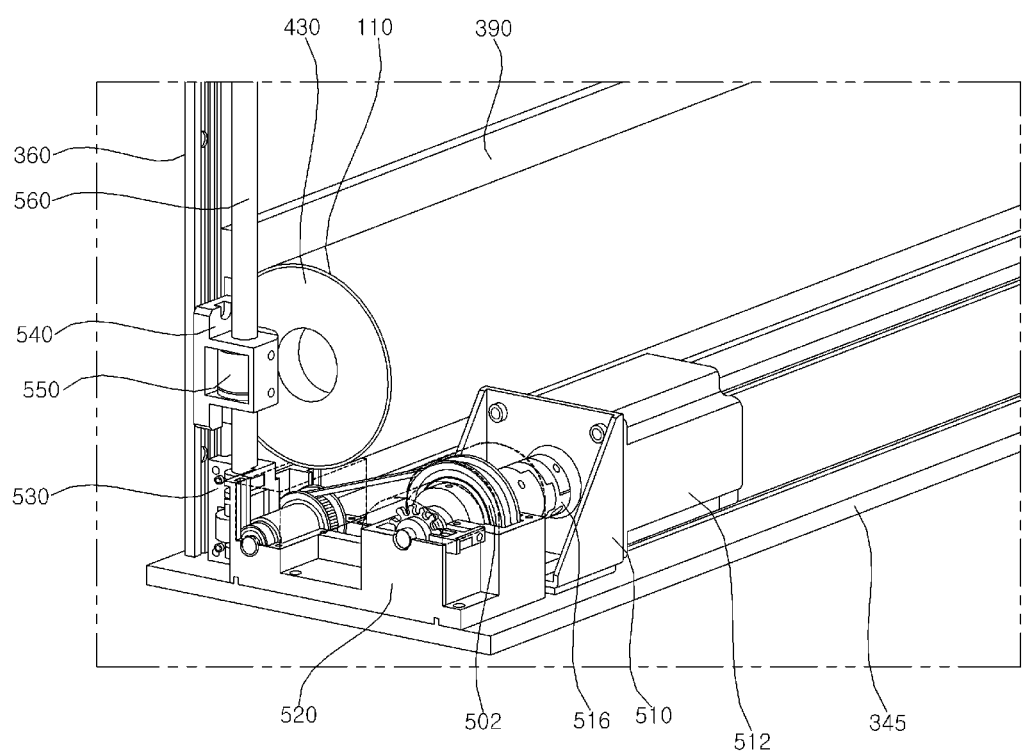

Referring to FIG. 12, a bracket 510 may be mounted on the bottom frame 345. The bracket 510 may be referred to as a motor bracket 510. The motor 512 may be located on the bottom frame 345 and may be fixed to the bracket 510. A pulley mount 520 may be mounted on the bottom frame 345. The pulley mount 520 may be located adjacent to the motor 512. The bracket 510 may be located between the pulley mount 520 and the motor 512.

A pulley 502 may be mounted on the pulley mount 520. The pulley 502 may rotate on the pulley mount 520. The joint 516 may connect the pulley 502 and the rotation shaft of the motor 512. The motor 512 may transmit power to pulley 502 via the joint 516. The pulley 502 may be referred to as a first pulley 502.

A lead screw 560 may be located parallel to the vertical frame 360. The lead screw 560 may be rotatably installed in the bottom frame 345. A screw mount 530 may be mounted on the bottom frame 345 while being adjacent to the vertical frame 360. The lead screw 560 may be rotatably coupled to the screw mount 530.

The lead screw 560 may be inserted into a slider 540. The slider 540 may move in the up-down direction of the lead screw 560. The slider 540 may move in the up-down direction while being in contact with the vertical frame 360. The bar 390 may be connected to or coupled to the slider 540. The slider 540 may move in the lead screw 560 in the up-down direction together with the bar 390.

A screw nut 550 may be coupled to the slider 540. The screw nut 550 may have a cylindrical shape and may have threads on its inner circumferential surface. The threads of the screw nut 550 may be engaged with threads formed on the outer circumferential surface of the lead screw 560. When the lead screw 560 rotates, the slider 540 may move in the up-down direction of the lead screw 560 by the screw nut 550.

Figure 13:
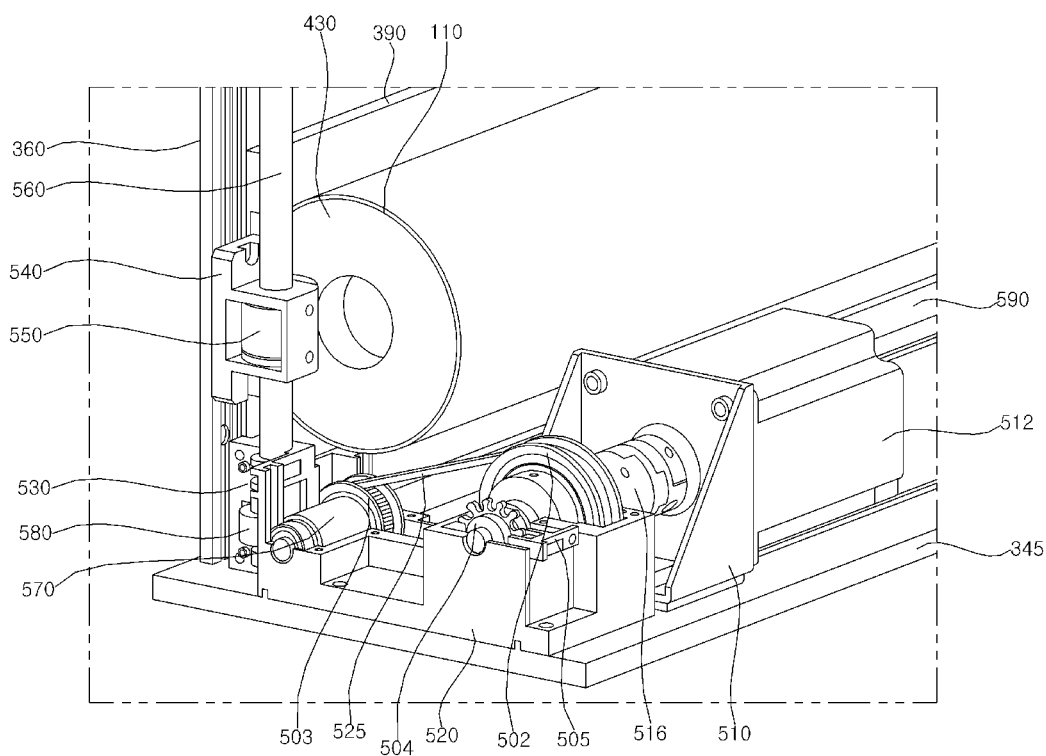

Referring to FIG. 13, an indicator 504 may be coupled to the rotation shaft of the first pulley 502. The indicator 504 may rotate with the first pulley 502. A sensor 505 may be mounted on the pulley mount 520 while being adjacent the indicator 504. The sensor 505 may detect the rotation of the indicator 504.

A second pulley 503 may be spaced apart from the first pulley 502 and mounted on the pulley mount 520. A diameter of the second pulley 503 may be smaller than a diameter of the first pulley 502. A belt 525 may connect the first pulley 502 and the second pulley 503. The belt 525 may contact the outer circumferential surface of the first pulley 502 and the outer circumferential surface of the second pulley 503. When the first pulley 502 rotates, the second pulley 503 may also rotate by the belt 525.

A transmission shaft 590 may be inserted into the second pulley 503, and rotatably installed in the pulley mount 520. The transmission shaft 590 may be fixed to the second pulley 503 and rotate together with the second pulley 503. The transmission shaft 590 may be inserted into a worm 570. The worm 570 may be installed in the pulley mount 520 while being adjacent to the screw mount 530. A worm gear 580 may be fixed to the lower end of the lead screw 560. The worm gear 580 may be engaged with the worm 570.

Accordingly, the rotational force provided by the motor 512 may be transmitted to the lead screw 560 through the first pulley 502, the belt 525, the second pulley 503, the worm 570, and the worm gear 580.

Figure 14:
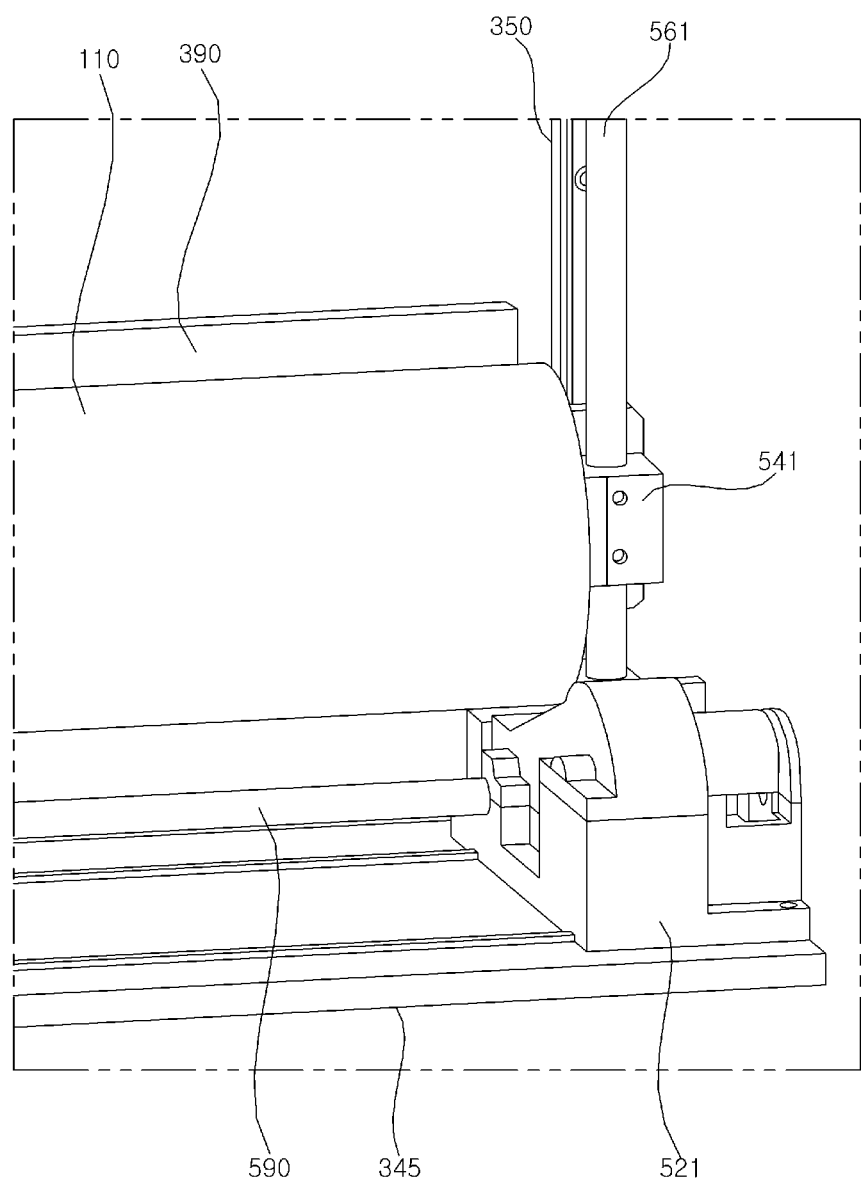

Referring to FIG. 14, a lead screw 561 may be located parallel to the vertical frame 350. The lead screw 561 may be rotatably installed in the bottom frame 345.

The lead screw 561 may be inserted into a slider 541. The slider 541 may move in the up-down direction of the lead screw 561. The slider 541 may move in the up-down direction while being in contact with the vertical frame 350. The bar 390 may be connected to or coupled to the slider 541. The slider 541 may move in the up-down direction in the lead screw 561 together with the bar 390.

A gearbox 521 may be mounted on the bottom mount 345. The gearbox 521 may connect the transmission shaft 590 and the lead screw 561. For example, the gearbox 521 may include a worm gear. The worm gear may transmit the rotational force of the transmission shaft 590 to the lead screw 561 to rotate the lead screw 561.

Figure 15:
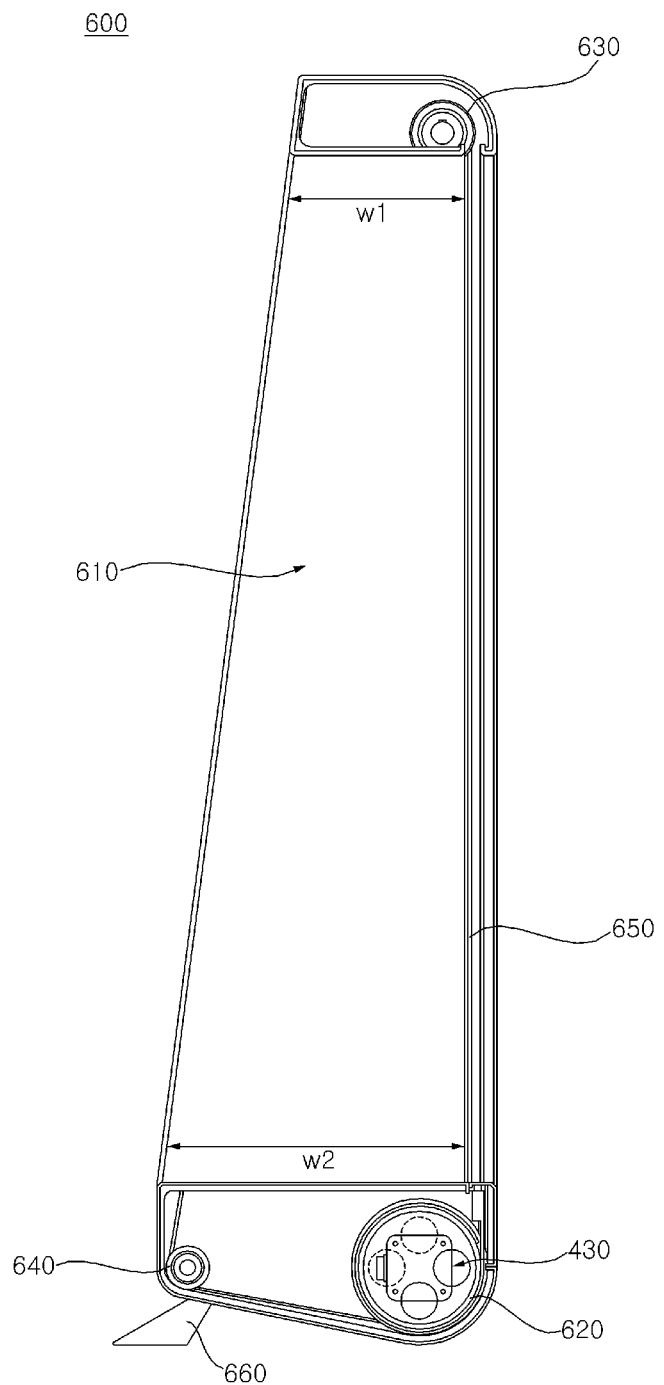

Referring to FIG. 15, a vertical frame 610 may extend long in the up-down direction, and an upper width W1 in the front-rear direction of the vertical frame 610 may be smaller than a lower width W2 in the front-rear direction of the vertical frame 610. The vertical frame 610 may have a front-rear width W that gradually becomes wider as it progresses from the upper side to the lower side.

A lower pulley 620 may be rotatably installed adjacent to the lower end of the vertical frame 610. The lower pulley 620 may be located adjacent to the front surface of the vertical frame 610. An upper pulley 630 may be rotatably installed adjacent to the upper end of the vertical frame 610. A tension pulley 640 may be located adjacent to the lower end of the vertical frame 610, and may be rotatably installed adjacent to the rear surface of the vertical frame 610. The tension pulley 640 may be spaced apart from the lower pulley 620.

The belt 650 may be wound around the lower pulley 620, the upper pulley 630, and the tension pulley 640. The tension pulley 640 may move in the front-rear direction or the up-down direction in the vertical frame 610. The tension pulley 640 may adjust the tension of the belt 650 while moving in the vertical frame 610.

Figure 16:
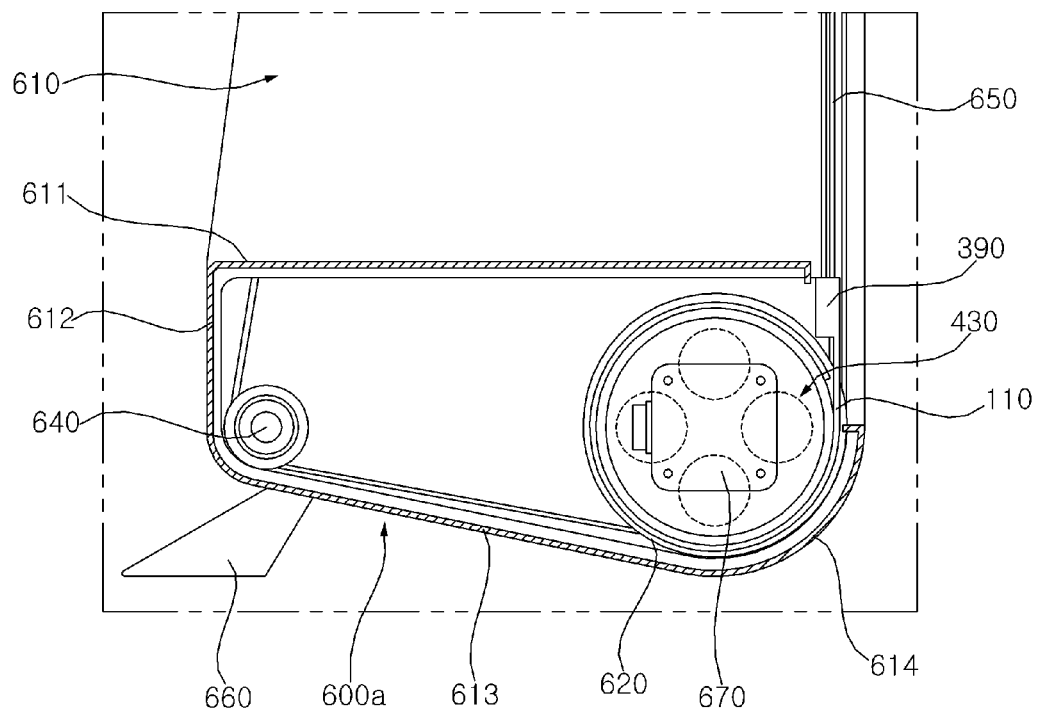

Referring to FIG. 16, the bar 390 may be fixed to the belt 650. The bar 390 may move with the belt 650. The bar 390 may move in the up-down direction of the vertical frame 610 together with the belt 650.

The display panel 110 may be wound around the panel roller 430. One end of the display panel 110 may be fixed to the panel roller 430, and the other end of the display panel 110 may be fixed to the bar 390. When the panel roller 430 winds around the display panel 110, the bar 390 may move adjacent to the panel roller 430. When the panel roller 430 unwinds the display panel 110, the bar 390 may move away from the panel roller 430.

A rotation shaft of a motor 670 may be aligned with a rotation shaft of the panel roller 430. The motor 670 may be installed in an inner side of the panel roller 430. The lower pulley 620 may rotate together with the panel roller 430. The motor 670 may provide a rotational force to the panel roller 430. When the panel roller 430 rotates by the rotational force provided by the motor 670, the lower pulley 430 may rotate.

Referring to FIGS. 15 and 16, a stand 660 may be fixed to the lower side of the vertical frame 610. The stand 660 may adjust a standing angle of the vertical frame 610.

Figure 17:
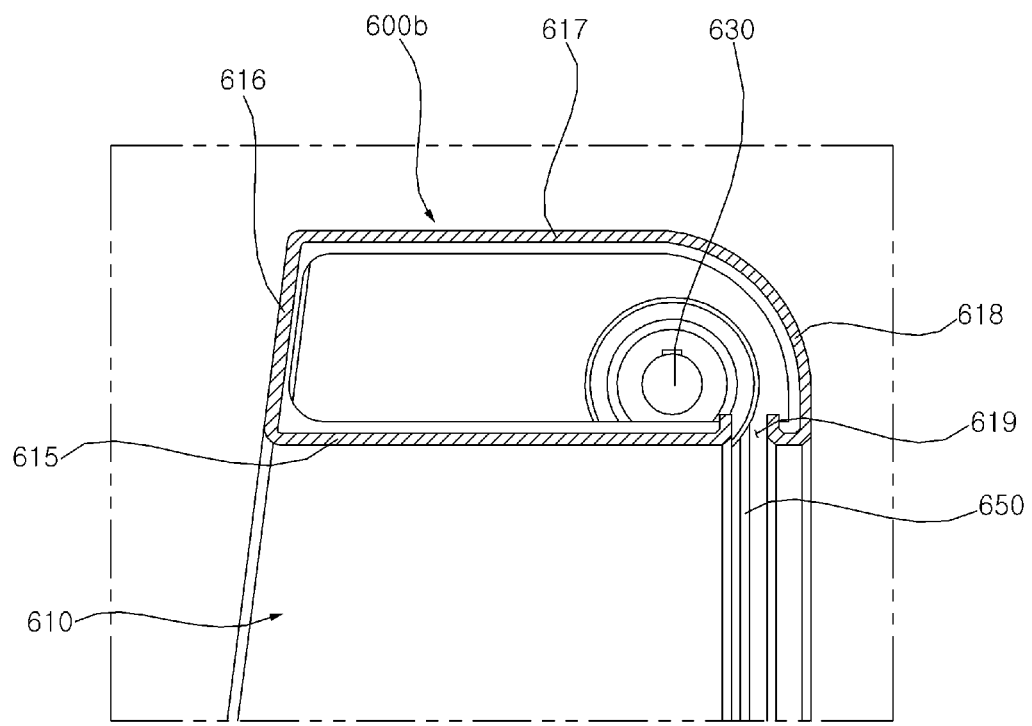

Referring to FIGS. 16 and 17, a bottom frame 600a may include an accommodation space. The bottom frame 600a may include an upper plate 611, a lower plate 613, a rear plate 612, and a front plate 614. The bottom frame 600a may have a box shape as a whole. The panel roller 430 and the lower pulley 620 may be located between the upper plate 611 and the lower plate 613 while being adjacent to the front plate 614. The front plate 614 and/or the lower plate 613 may be curved with a curvature corresponding to a curvature of the panel roller 430 or the lower pulley 620. The lower plate 613 and/or the rear plate 612 may be curved with a curvature corresponding to a curvature of the tension pulley 640.

The height of the front plate 614 may be smaller than the diameter of the panel roller 340 or the lower pulley 620. The bottom frame 600a may include an opening which is an opened portion of the front surface. In a state in which the display panel 110 is wound around the panel roller 340, the bar 390 and/or a portion of the upper end of the display panel 110 may be located on the opening.

A top frame 600b may have an accommodation space. The top frame 600b may include an upper plate 617, a lower plate 615, a rear plate 616, and a front plate 618. The top frame 600b may have a box shape as a whole. The upper pulley 630 may be located between the upper plate 617 and the lower plate 615 while being adjacent to the front plate 618. The front plate 618 and/or the upper plate 617 may be curved with a curvature corresponding to a curvature of the upper pulley 630.

The top frame 600b may include an opening 619 which is an opened portion of the lower surface. The opening 619 may be located adjacent to the front surface of the outer circumferential surface of the upper pulley 630. In a state in which the display panel 110 is unwound from the panel roller 430, the bar 390 may be located in the opening 619.

Figure 18:
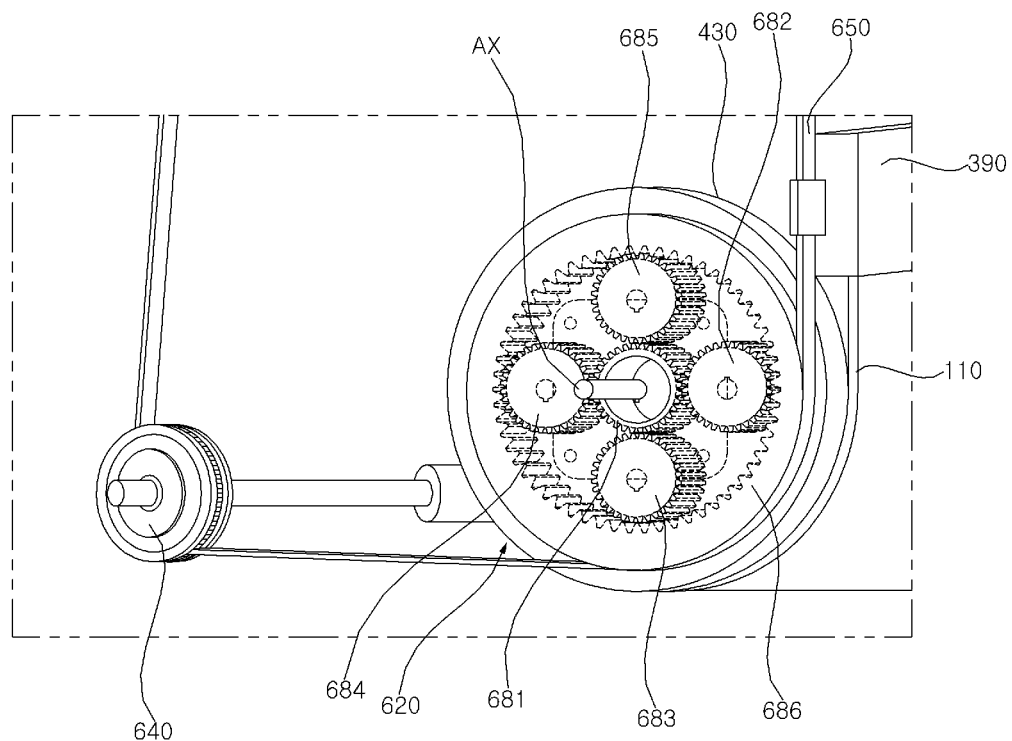
Figure 19:
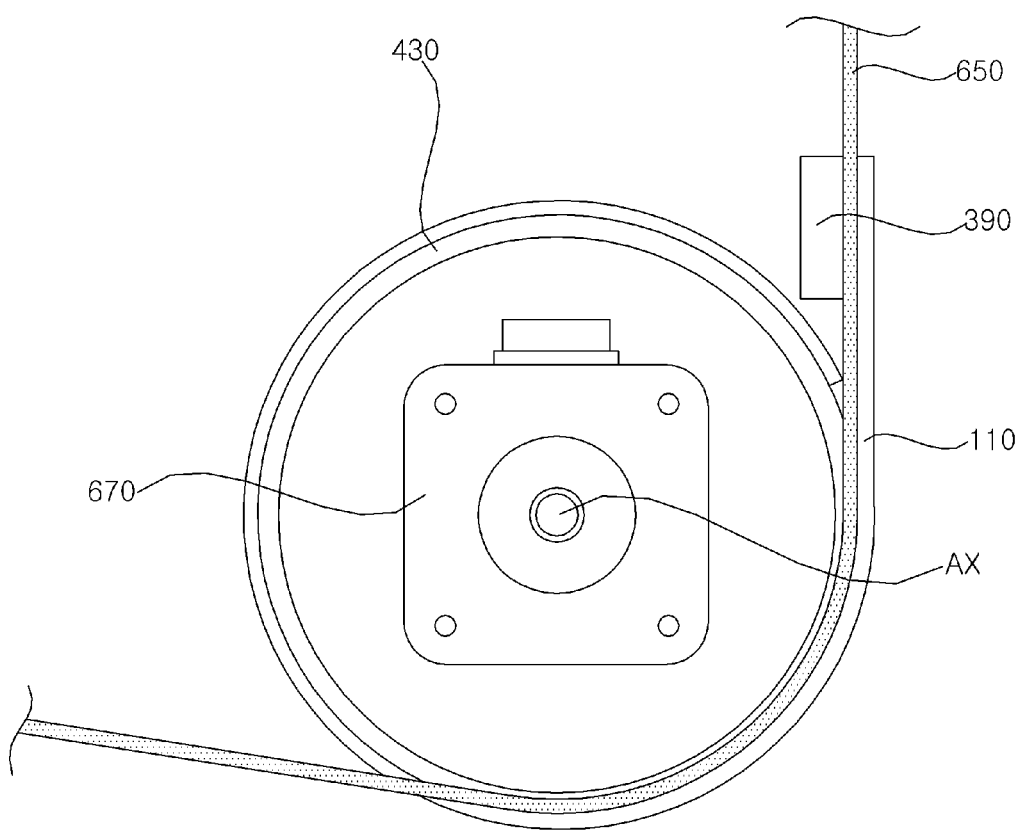
Figure 20:
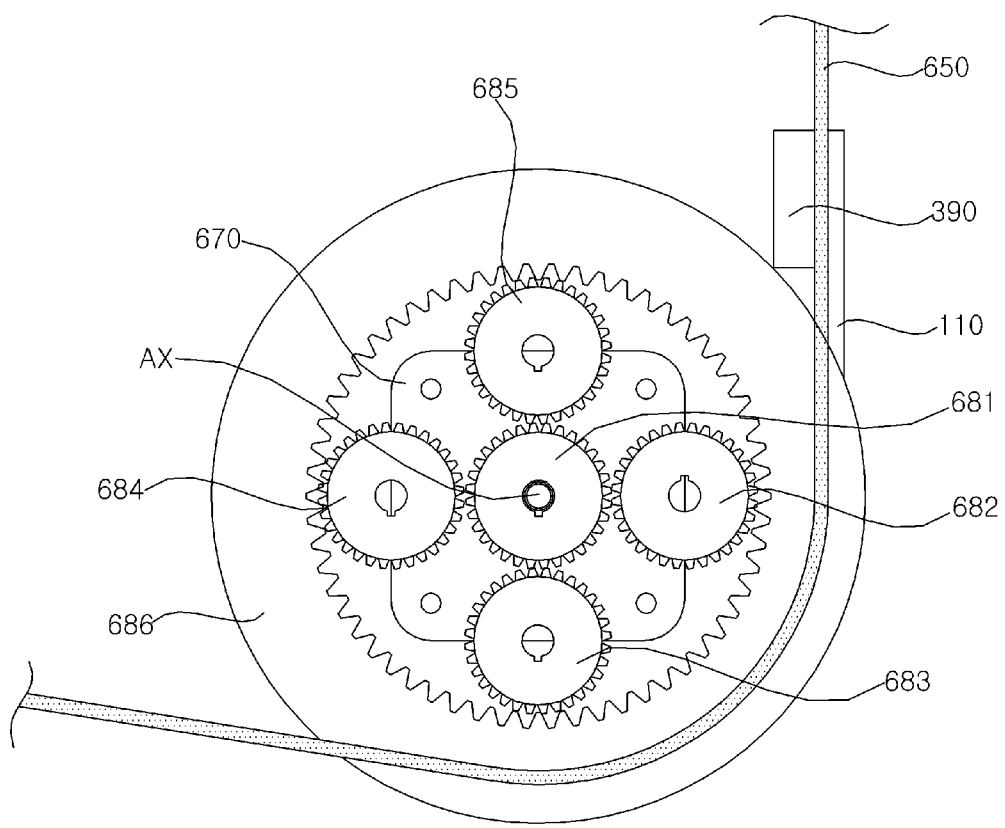

Referring to FIGS. 18 to 20, the panel roller 430 may have an elongated cylindrical shape. The motor 670 may be located in an inner side of the panel roller 430. A motor gear 681 may be fixed to a rotation shaft AX of the motor 670. A driving gear 686 may be an inner ring gear. The driving gear 686 may be coupled to one end of the panel roller 430 adjacent to the motor 670. The driving gear 686 may rotate together with the panel roller 430. A motor gear 681 may be located in the center of the driving gear 686.

A first planetary gear 682 may be located between the inner circumferential surface of the driving gear 686 and the motor gear 681. The first planetary gear 682 may be engaged with the driving gear 686 and the motor gear 681. A second planetary gear 683 may be located between the inner circumferential surface of the driving gear 686 and the motor gear 681. The second planetary gear 683 may be engaged with the driving gear 686 and the motor gear 681. A third planetary gear 684 may be located between the inner circumferential surface of the driving gear 686 and the motor gear 681. The third planetary gear 684 may be engaged with the driving gear 686 and the motor gear 681. A fourth planetary gear 685 may be located between the inner circumferential surface of the driving gear 686 and the motor gear 681. The fourth planetary gear 685 may be engaged with the driving gear 686 and the motor gear 681. The planetary gears 682, 683, 684, and 685 may be spaced apart from each other.

The motor 670 may provide power to the motor gear 681 to rotate the motor gear 681. The motor gear 681 may rotate the planetary gears 682, 683, 684, and 685 engaged with the motor gear 681, and the planetary gears 682, 683, 684, 685 may rotate the driving gear 681. Accordingly, the rotational force provided by the motor 670 may be transmitted to the panel roller 430.

The lower pulley 620 may be fixed to the driving gear 686. The lower pulley 620, the driving gear 686, and the panel roller 430 may rotate together.

According to an aspect of the present disclosure, provided is a display device including: a flexible display panel; a panel roller which extends long, and around which the display panel is wound, or from which the display panel is unwound; a driving gear which is located in one side of the panel roller, and rotates together with the panel roller; and a motor which is located inside the panel roller, and provides power to the driving gear.

According to another aspect of the present disclosure, the display device further includes: a motor gear fixed to a rotation shaft of the motor; and at least one planetary gear engaged with the motor gear, wherein the driving gear is an inner ring gear engaged with the at least one planetary gear.

According to another aspect of the present disclosure, the display device further includes: a first pulley which is coupled to the driving gear, and rotates together with the panel roller; a second pulley spaced apart from the first pulley; a belt connecting the first pulley and the second pulley; and a bar fixed to the belt at between the first pulley and the second pulley, wherein a distal end of the display panel is fixed to the bar.

According to another aspect of the present disclosure, the display device further includes a tension pulley for pulling the belt in a direction intersecting with a direction in which the bar moves.

According to another aspect of the present disclosure, the display device further includes a bottom frame on which the panel roller is rotatably mounted; a top frame which is parallel to the bottom frame, and spaced apart from the bottom frame; and a vertical frame connecting the bottom frame and the top frame, wherein the first pulley is installed on the bottom frame, the second pulley is installed on the top frame, and the belt is installed on the vertical frame.

According to another aspect of the present disclosure, provided is a display device including: a flexible display panel; a panel roller which extends long, and around which the display panel is wound, or from which the display panel is unwound; a bottom frame in which the panel roller is rotatably mounted; a motor mounted in the bottom frame; a first vertical frame which extends in a direction intersecting with a length direction of the panel roller, and is fixed to the bottom frame; a first lead screw which is parallel to the first vertical frame, and rotatably coupled to the bottom frame; a first slider which moves in a length direction of the first lead screw when the first lead screw rotates; and a bar to which a distal end of the display panel is fixed, and which is coupled to the first slider.

According to another aspect of the present disclosure, the display device further includes a first screw nut into which the first lead screw is inserted, and which is engaged with a thread of the first lead screw, wherein the first slider is coupled to the first screw nut, and moves in a length direction of the first lead screw while being in contact with the first vertical frame.

According to another aspect of the present disclosure, the display device further includes a worm gear rotating the first lead screw; a first pulley providing a rotational force to the worm gear; a second pulley connected to a rotation shaft of the motor; and a belt connecting the first pulley and the second pulley.

According to another aspect of the present disclosure, the display device further includes an indicator rotating together with the second pulley; and a sensor for detecting a rotation of the indicator.

According to another aspect of the present disclosure, the display device further includes a second vertical frame which is parallel to the first vertical frame, and fixed to the bottom frame; a second lead screw which is parallel to the second vertical frame, and rotatably coupled to the bottom frame; and a second slider which moves in a length direction of the second lead screw when the second lead screw rotates, wherein the bar has one side fixed to the first slider and the other side fixed to the second slider.

According to another aspect of the present disclosure, the display device further includes a second screw nut to which the second lead screw is inserted, and which is engaged with a thread of the second lead screw, wherein the second slider is coupled to the second screw nut, and moves in a length direction of the second lead screw while being in contact with the second vertical frame.

According to another aspect of the present disclosure, the display device further includes a worm gear for rotating the second vertical frame; and a transmission shaft which is parallel to the panel roller, has one side fixed to the first pulley, and has the other side rotating the worm gear.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
   a flexible display panel;
   a panel roller extending along a length direction, around or from which the flexible display panel is configured to be wound or unwound;
   a driving gear located at a side of the panel roller, and configured to rotate together with the panel roller;
   a motor located inside the panel roller, and configured to provide power to the driving gear;
   a motor gear fixed to a rotation shaft of the motor;
   at least one planetary gear engaged with the motor gear;
   a first pulley coupled to the driving gear, and configured to rotate together with the panel roller;
   a second pulley spaced apart from the first pulley;
   a belt connecting the first pulley and the second pulley; and
   a bar fixed to the belt between the first pulley and the second pulley,
   wherein a distal end of the flexible display panel is fixed to the bar.

2. The display device of claim 1, further comprising a tension pulley configured to pull the belt in a direction intersecting with a direction in which the bar moves.

3. The display device of claim 2, further comprising:
a bottom frame on which the panel roller is rotatably mounted;
a top frame which is parallel to the bottom frame, and spaced apart from the bottom frame; and
a vertical frame connecting the bottom frame and the top frame,
wherein the first pulley is installed on the bottom frame,
wherein the second pulley is installed on the top frame, and
wherein the belt is installed on the vertical frame.

4. A display device comprising:
a flexible display panel;
a panel roller extending along a length direction, around or from which the flexible display panel is configured to be wound or unwound;
a bottom frame in which the panel roller is rotatably mounted;
a motor mounted in the bottom frame;
a first vertical frame extending along a direction intersecting with the length direction of the panel roller, and fixed to the bottom frame;
a first lead screw which is parallel to the first vertical frame, and rotatably coupled to the bottom frame;
a first screw nut into which the first lead screw is inserted, wherein the first screw nut is engaged with a thread of the first lead screw;
a worm gear configured to rotate the first lead screw;
a first pulley configured to provide a rotational force to the worm gear;
a second pulley connected to a rotation shaft of the motor;
a belt connecting the first pulley and the second pulley;
a first slider coupled to the first screw nut, and configured to move along a length direction of the first lead screw while being in contact with the first vertical frame when the first lead screw rotates; and
a bar to which a distal end of the flexible display panel is fixed, wherein the bar is coupled to the first slider.

5. The display device of claim 4, further comprising:
an indicator configured to rotate together with the second pulley; and
a sensor configured to detect a rotation of the indicator.

6. A display device comprising:
a flexible display panel;
a panel roller extending along a length direction, around or from which the flexible display panel is configured to be wound or unwound;
a bottom frame in which the panel roller is rotatably mounted;
a motor mounted in the bottom frame;
a first vertical frame extending along a direction intersecting with the length direction of the panel roller, and fixed to the bottom frame;
a first lead screw which is parallel to the first vertical frame, and rotatably coupled to the bottom frame;
a first slider configured to move along a length direction of the first lead screw when the first lead screw rotates;
a bar to which a distal end of the flexible display panel is fixed, wherein the bar is coupled to the first slider;
a second vertical frame which is parallel to the first vertical frame, and fixed to the bottom frame;
a second lead screw which is parallel to the second vertical frame, and rotatably coupled to the bottom frame; and
a second slider configured to move along a length direction of the second lead screw when the second lead screw rotates,
wherein the bar has a first side fixed to the first slider and a second side fixed to the second slider.

7. The display device of claim 6, further comprising a second screw nut to which the second lead screw is inserted, wherein the second screw nut is engaged with a thread of the second lead screw,
wherein the second slider is coupled to the second screw nut, and configured to move along a length direction of the second lead screw while being in contact with the second vertical frame.

8. The display device of claim 7, further comprising:
a worm gear configured to rotate the second vertical frame; and
a transmission shaft which is parallel to the panel roller, wherein the transmission shaft has a first side fixed to the first pulley, and a second side configured to rotate the worm gear.

* * * * *